United States Patent
Fung et al.

(10) Patent No.: US 11,004,934 B2
(45) Date of Patent: May 11, 2021

(54) SEMICONDUCTOR DEVICE INCLUDING A LINER LAYER BETWEEN A CHANNEL AND A SOURCE/DRAIN EPITAXIAL LAYER

(71) Applicant: TAIWAN SEMICONDUCTOR MANUFACTURING CO., LTD., Hsinchu (TW)

(72) Inventors: Ka-Hing Fung, Hsinchu County (TW); Kuo-Cheng Ching, Hsinchu County (TW); Ying-Keung Leung, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/226,088

(22) Filed: Dec. 19, 2018

(65) Prior Publication Data
US 2019/0148490 A1    May 16, 2019

Related U.S. Application Data

(63) Continuation of application No. 15/064,402, filed on Mar. 8, 2016, now Pat. No. 10,164,012.
(Continued)

(51) Int. Cl.
*H01L 29/775* (2006.01)
*H01L 29/06* (2006.01)
(Continued)

(52) U.S. Cl.
CPC .......... *H01L 29/0673* (2013.01); *B82Y 10/00* (2013.01); *H01L 21/02381* (2013.01); *H01L 21/30604* (2013.01); *H01L 29/0649* (2013.01); *H01L 29/0843* (2013.01); *H01L 29/41725* (2013.01); *H01L 29/42392* (2013.01); *H01L 29/66439* (2013.01); *H01L 29/66545* (2013.01);
(Continued)

(58) Field of Classification Search
CPC . H01L 29/0676; H01L 29/785; H01L 21/845; H01L 27/0886; H01L 27/0924; H01L 27/10879; H01L 27/1211; H01L 29/41791; H01L 29/66795; H01L 29/7831; H01L 2029/7858
See application file for complete search history.

(56) References Cited

U.S. PATENT DOCUMENTS

| | | |
|---|---|---|
| 2013/0161756 A1 | 6/2013 | Glass et al. |
| 2014/0197377 A1 | 7/2014 | Kim et al. |
| | (Continued) | |

OTHER PUBLICATIONS

Office Action dated Aug. 9, 2017 in corresponding Taiwanese Patent Application No. 105125126.
(Continued)

*Primary Examiner* — Suberr L Chi
(74) *Attorney, Agent, or Firm* — McDermott Will & Emery LLP

(57) ABSTRACT

A semiconductor device includes first channel layers disposed over a substrate, a first source/drain region disposed over the substrate, a gate dielectric layer disposed on and wrapping each of the first channel layers, a gate electrode layer disposed on the gate dielectric layer and wrapping each of the first channel layers, and a liner semiconductor layer disposed between the first channel layers and the first source/drain region.

20 Claims, 13 Drawing Sheets

Related U.S. Application Data

(60) Provisional application No. 62/261,264, filed on Nov. 30, 2015.

(51) Int. Cl.
| | | |
|---|---|---|
| *H01L 29/66* | (2006.01) | |
| *H01L 21/306* | (2006.01) | |
| *H01L 21/02* | (2006.01) | |
| *H01L 29/423* | (2006.01) | |
| *H01L 29/78* | (2006.01) | |
| *H01L 29/786* | (2006.01) | |
| *B82Y 10/00* | (2011.01) | |
| *H01L 29/417* | (2006.01) | |
| *H01L 29/08* | (2006.01) | |

(52) U.S. Cl.
CPC .. *H01L 29/66742* (2013.01); *H01L 29/66795* (2013.01); *H01L 29/775* (2013.01); *H01L 29/785* (2013.01); *H01L 29/78654* (2013.01); *H01L 29/78684* (2013.01); *H01L 29/78696* (2013.01)

(56) References Cited

U.S. PATENT DOCUMENTS

2014/0312432 A1 10/2014 Ching et al.
2017/0005195 A1* 1/2017 Ching .................. H01L 29/165

OTHER PUBLICATIONS

Office Action dated Oct. 17, 2017 in corresponding Korean Patent Application No. 10-2016-0136416.
Office Action dated Apr. 16, 2018 in corresponding Korean Patent Application No. 10-2016-0136416.
Non-Final Office Action dated Nov. 10, 2016 issued in parent U.S. Appl. No. 15/064,402.
Final Office Action dated Jun. 30, 2017 issued in parent U.S. Appl. No. 15/064,402.
Non-Final Office Action dated Dec. 18, 2017 issued in parent U.S. Appl. No. 15/064,402.
Final Office Action dated Jun. 28, 2018 issued in parent U.S. Appl. No. 15/064,402.

* cited by examiner

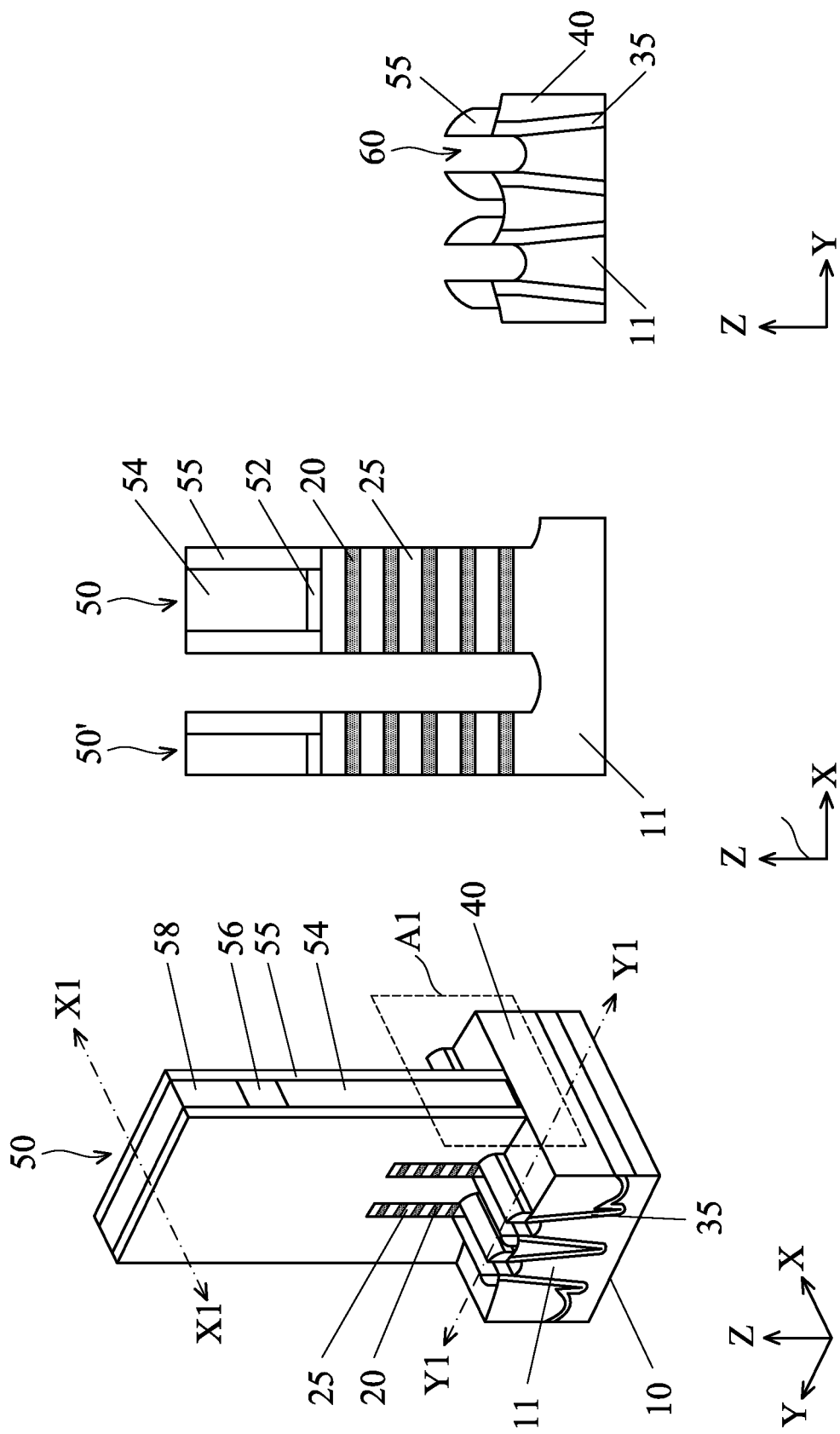

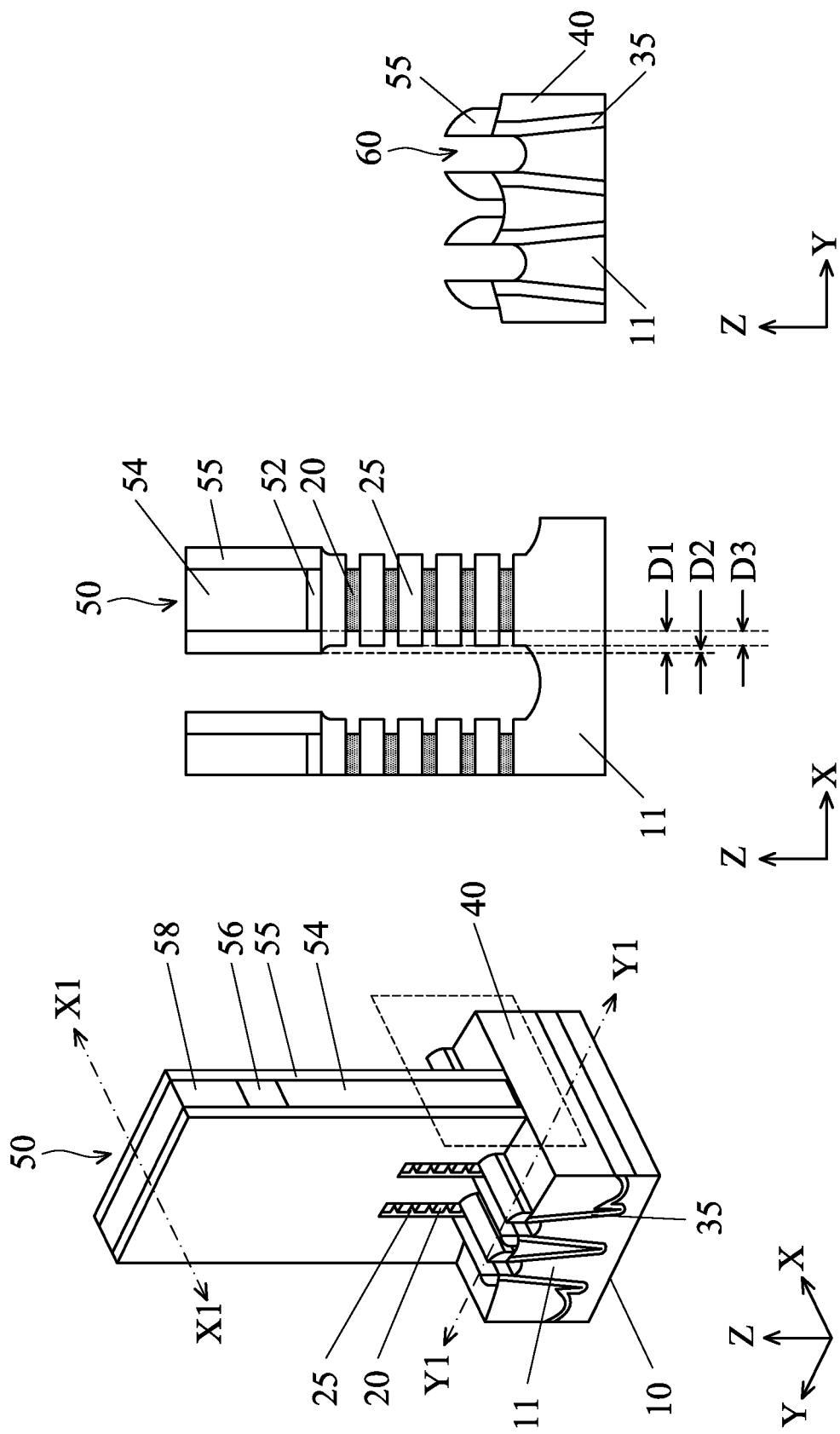

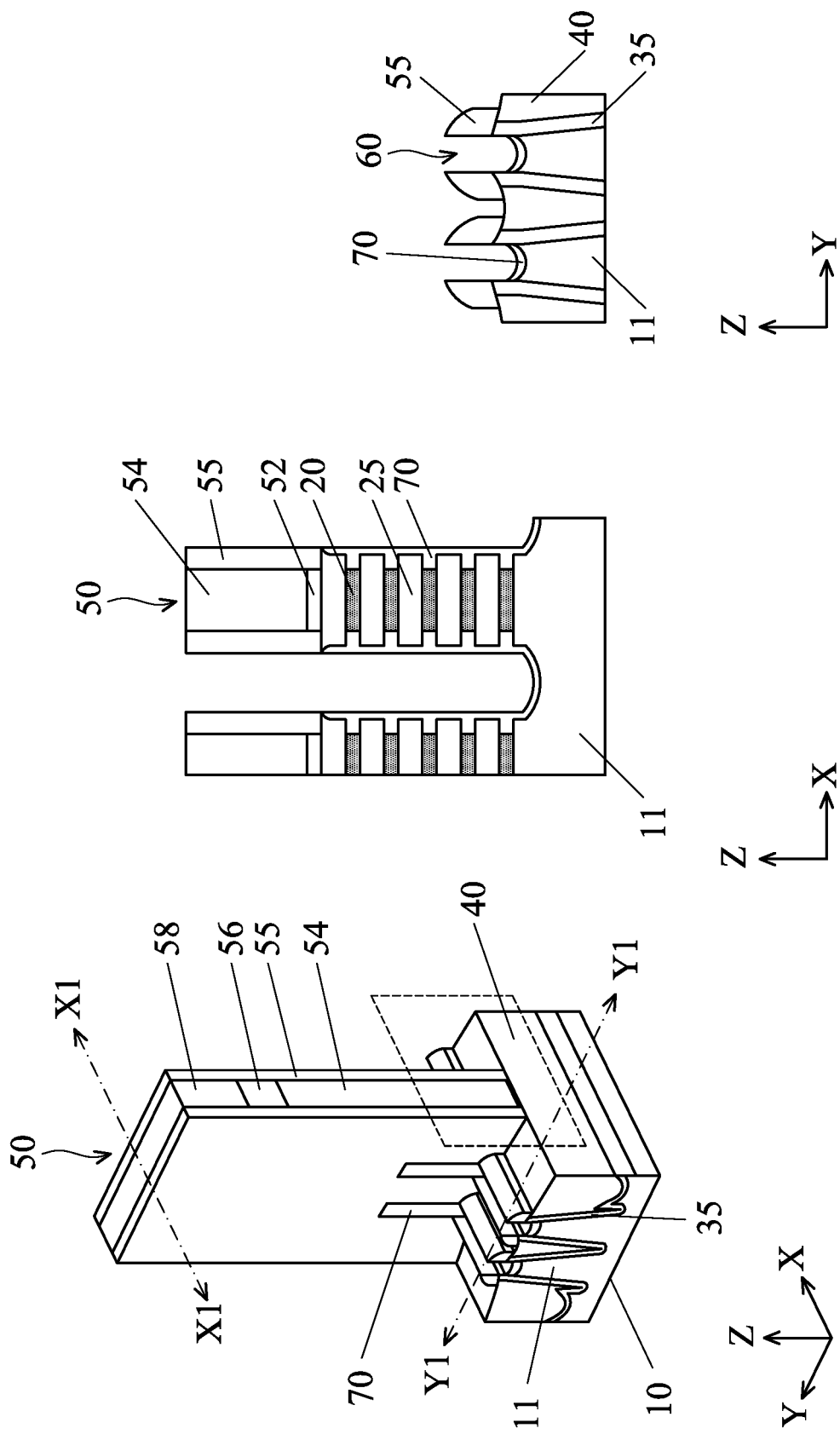

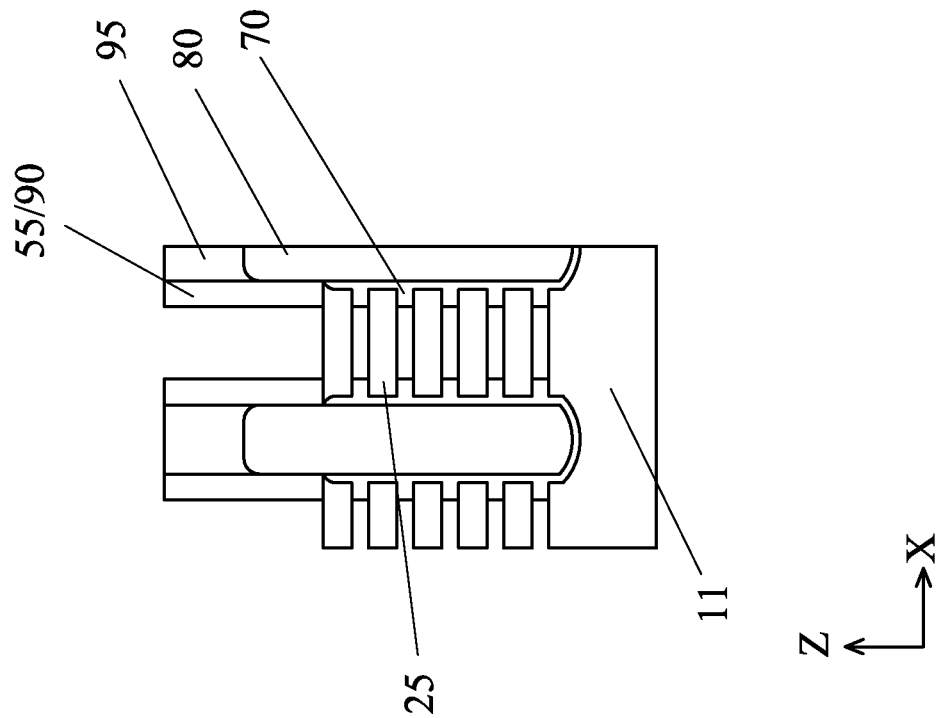
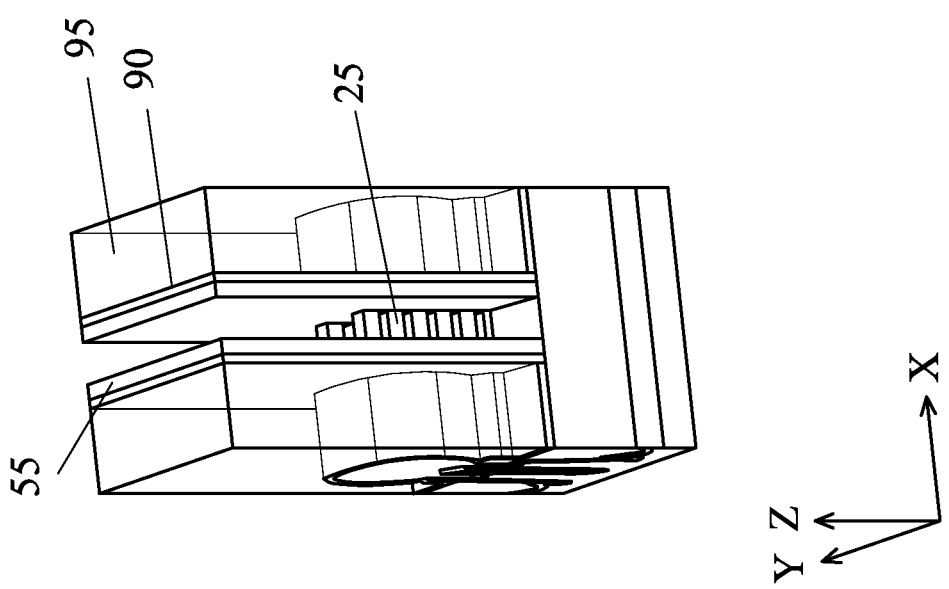
FIG. 15B
FIG. 15A

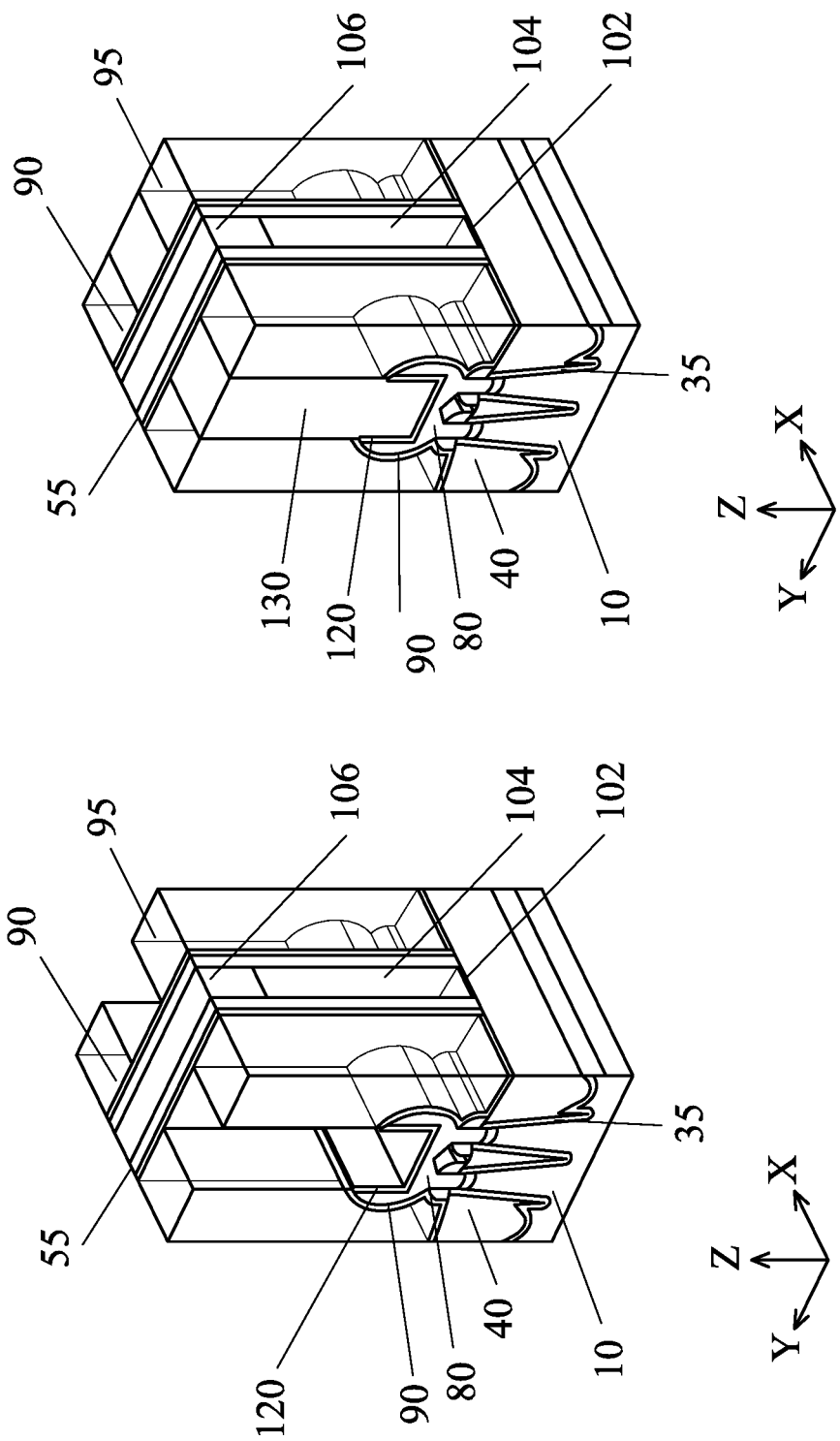

SEMICONDUCTOR DEVICE INCLUDING A LINER LAYER BETWEEN A CHANNEL AND A SOURCE/DRAIN EPITAXIAL LAYER

CROSS-REFERENCE TO RELATED APPLICATIONS

This application is a Continuation Application of U.S. patent application Ser. No. 15/064,402 filed Mar. 8, 2016, which claims priority to U.S. Provisional Patent Application 62/261,264 filed Nov. 30, 2015, the entire disclosures of which are incorporated herein by reference.

TECHNICAL FIELD

The disclosure relates to a semiconductor integrated circuit, and more particularly to a semiconductor device having a gate-all-around structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL).

As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1-20C show exemplary sequential processes for manufacturing the GAA FET device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-20C show exemplary sequential processes for manufacturing the GAA FET device according to one embodiment of the present disclosure. It is understood that additional operations can be provided before, during, and after processes shown by FIGS. 1-20C, and some of the operations described below can be replaced or eliminated, for additional embodiments of the method. The order of the operations/processes may be interchangeable.

Figure 1:
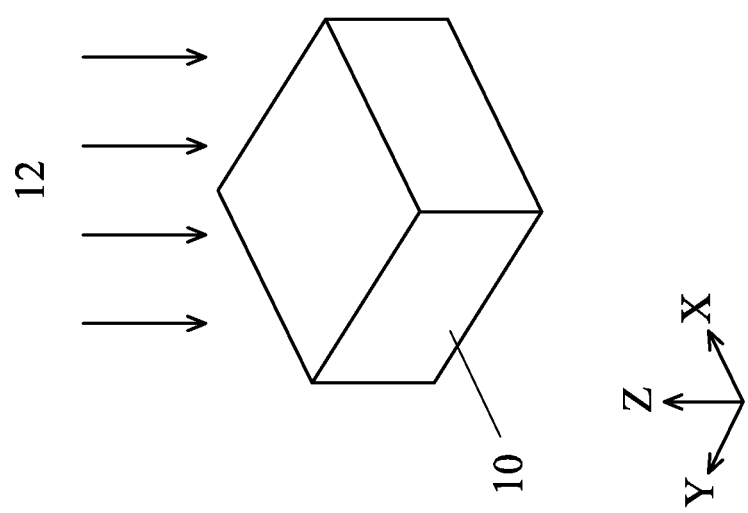

As shown in FIG. 1, impurity ions (dopants) 12 are implanted into a silicon substrate 10 to form a well region. The ion implantation is performed to prevent a punch-through effect.

In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 2:
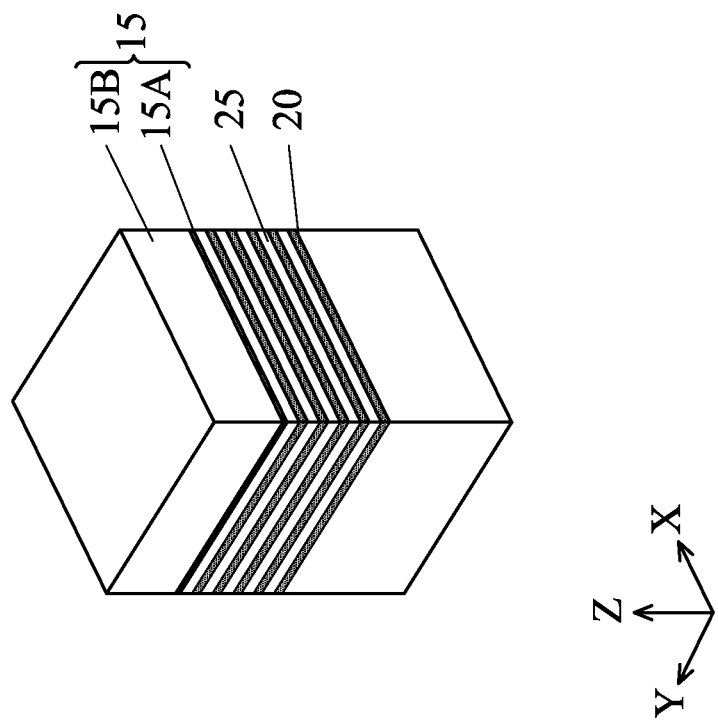

In FIG. 2, stacked semiconductor layers are formed over the substrate 10. The stacked semiconductor layers include first semiconductor layers 20 and second semiconductor layers 25. Further, a mask layer 15 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4.

In FIG. 2, five layers of the first semiconductor layer 20 and six layers of the second semiconductor layer 25 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 3:
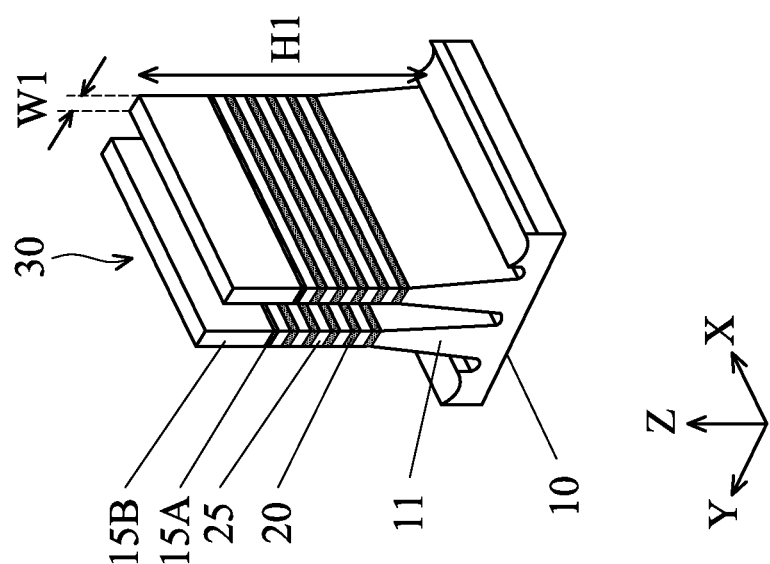

Next, as shown in FIG. 3, the stacked layers of the first and second semiconductor layers 20, 25 are patterned by using the patterned mask layer, thereby the stacked layers are formed into fin structures 30 extending in the X direction. In FIG. 3, two fin structures 30 are arranged in the Y direction. But the number of the fin structures is not limited to, and may be as small as one and three or more. In some embodiments, one or more dummy fin structures are formed on both sides of the fin structures 30 to improve pattern fidelity in the patterning operations.

As shown in FIG. 3, the fin structures 30 have upper portions constituted by the stacked semiconductor layers 20, 25 and well portions 11.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

After the fin structure is formed, an insulating material layer 41 including one or more layers of insulating material is formed over the substrate so that the fin structures are fully embedded in the insulating layer 41. The insulating material for the insulating layer 41 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 41. Then, a planarization operation, such as a chemical mechanical polishing (CMP) method and/or an etch-back method, is performed such that the upper surface of the uppermost second semiconductor layer 25 is exposed from the insulating material layer 41 as shown in FIG. 4.

Figure 4:
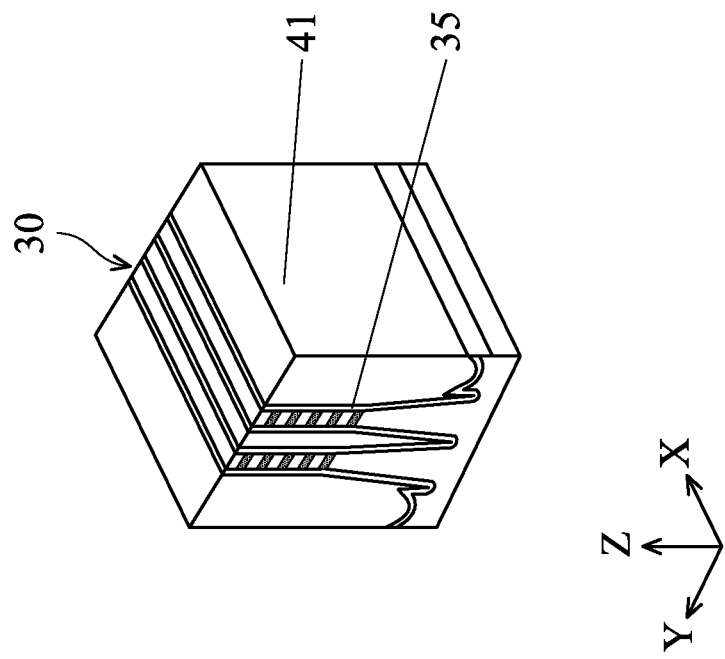

In some embodiments, a first liner layer 35 is formed over the structure of FIG. 3 before forming the insulating material layer 41, as shown FIG. 4. The first liner layer 35 is made of SiN or a silicon nitride-based material (e.g., SiON, SiCN or SiOCN).

Figure 5:
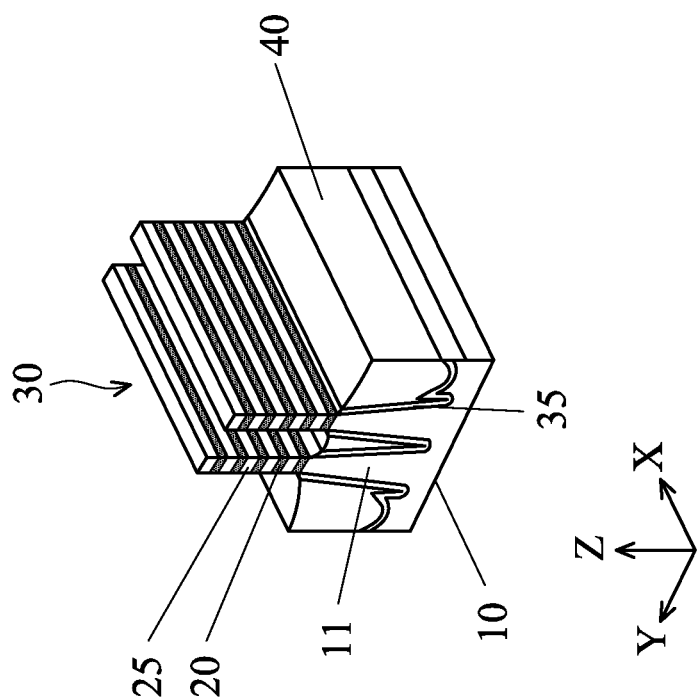

Then, as shown in FIG. 5, the insulating material layer 41 is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI).

In the embodiment shown in FIG. 5, the insulating material layer 41 is recessed until the bottommost first semiconductor layer 20 is exposed. In other embodiments, the upper portion of the well layer 11 is also partially exposed. The first semiconductor layers 20 are sacrificial layers which are subsequently partially removed, and the second semiconductor layers 25 are subsequently formed into channel layers of a GAA FET.

Figure 6:
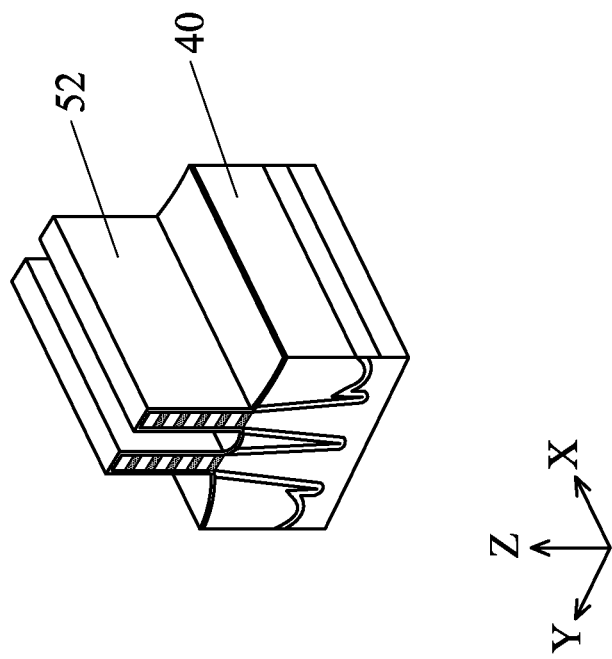

After the isolation insulating layer 40 is formed, a sacrificial gate dielectric layer 52 is formed, as shown in FIG. 6. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

Figure 7:
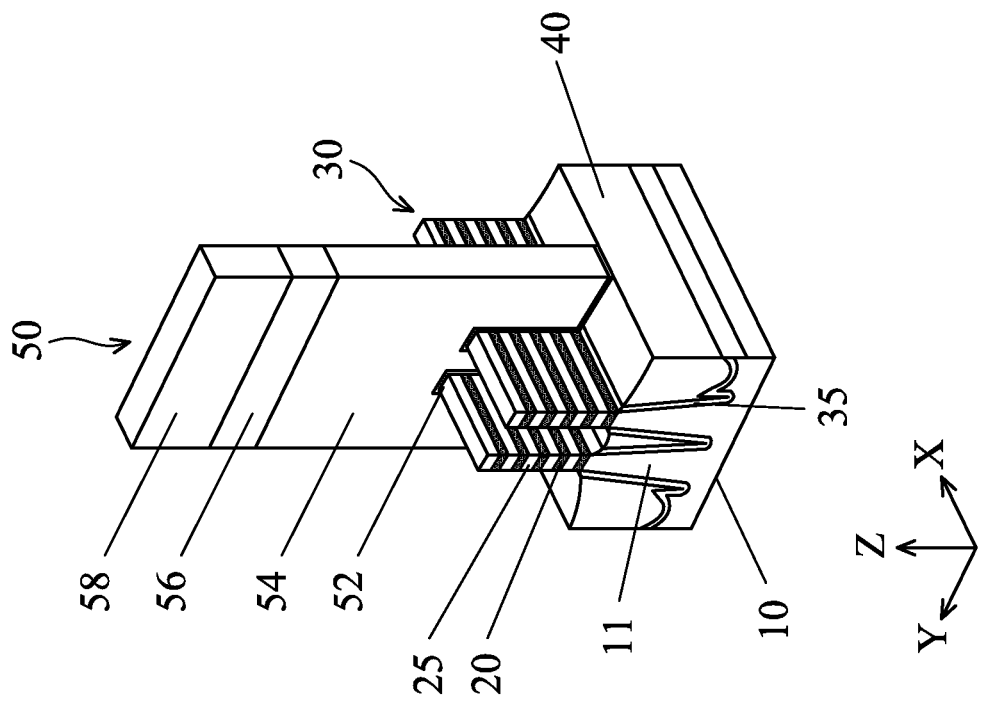

FIG. 7 illustrates a structure after a sacrificial gate structure 50 is formed over the exposed fin structures 30. The sacrificial gate structure includes a sacrificial gate electrode 54 and the sacrificial gate dielectric layer 52. The sacrificial gate structure 50 is formed over a portion of the fin structure which is to be a channel region. The sacrificial gate structure defines the channel region of the GAA FET.

The sacrificial gate structure 50 is formed by first blanket depositing the sacrificial gate dielectric layer 52 over the fin structures, as shown in FIG. 7. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 7. The sacrificial gate structure includes the sacrificial gate dielectric layer 52, the sacrificial gate electrode layer 54 (e.g., poly silicon), the pad SiN layer 56 and the silicon oxide mask layer 58. By patterning the sacrificial gate structure, the stacked layers of the first and second semiconductor layers are partially exposed on opposite sides of the sacrificial gate structure, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 8:
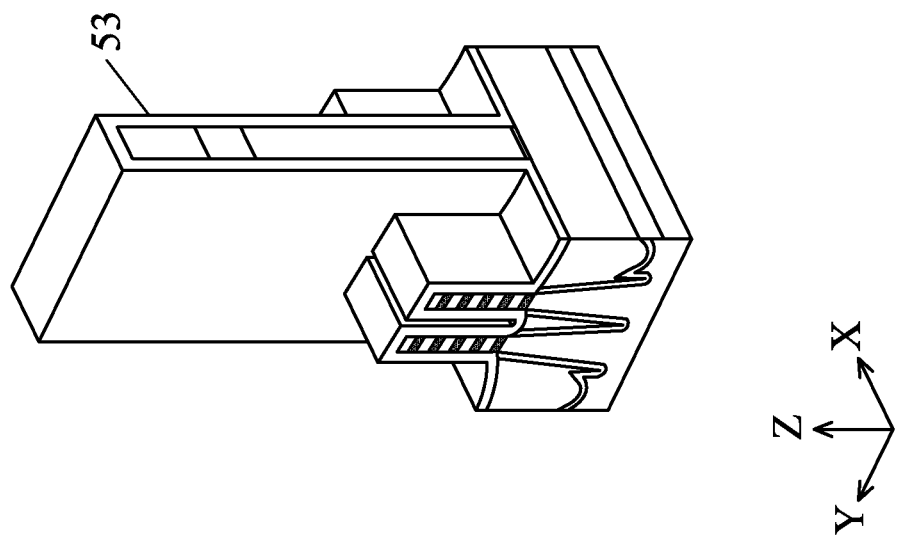

After the sacrificial gate structure is formed, a blanket layer 53 of an insulating material for sidewall spacers 55 is conformally formed by using CVD or other suitable methods, as shown in FIG. 8. The blanket layer 53 is deposited in a conformal manner so that it is formed to have substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 10 nm. In one embodiment, the insulating material of the blanket layer 53 is a silicon nitride-based material, such as SiN, SiON, SiOCN or SiCN and combinations thereof.

Further, as shown in FIGS. 9A-9C, sidewall spacers 55 are formed on opposite sidewalls of the sacrificial gate structures, and subsequently, the fin structures of the S/D regions are recessed down below the upper surface of the isolation insulating layer 40. FIG. 9B is the cross sectional view corresponding to area A1 and line X1-X1 of FIG. 9A, and FIG. 9C is the cross sectional view corresponding to line Y1-Y1 of FIG. 9A. In FIG. 9B, the cross section of the bottom parts of one sacrificial gate structure 50 and an adjacent sacrificial gate structure 50' are illustrated.

After the blanket layer 53 is formed, anisotropic etching is performed on the blanket layer 53 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 58 may be exposed from the sidewall spacers. In some embodiments, isotropic etching may be subsequently performed to remove the insulating material from the upper portions of the S/D region of the exposed fin structures 30.

Subsequently, the fin structures of the S/D regions are recessed down below the upper surface of the isolation insulating layer 40, by using dry etching and/or wet etching. As shown in FIGS. 9A and 9C, the sidewall spacers 55 formed on the S/D regions of the exposed fin structures partially remain. In other embodiments, however, the sidewall spacers 55 formed on the S/D regions of the exposed fin structures are fully removed. At this stage, end portions of the stacked layer of the first and second semiconductor layers 20, 25 under the sacrificial gate structure have substantially flat faces which are flush with the sidewall spacers 55, as shown in FIG. 9B. In some embodiments, the end portions of the stacked layer of the first and second semiconductor layers 20, 25 are slightly horizontally etched.

Subsequently, as shown in FIGS. 10A-10C, the first semiconductor layers 20 are horizontally recessed (etched) so that edges of the first semiconductor layers 20 are located substantially below a side face of the sacrificial gate electrode layer 54. As shown in FIG. 10B, end portions (edges) of the first semiconductor layers 20 under the sacrificial gate structure are substantially flush with the side faces of the sacrificial gate electrode layer 54. Here, "being substantially flush" means the difference in the relative position is less than about 1 nm.

During the recess etching of the first semiconductor layers 20 and/or the recess etching of the first and second semiconductor layers as described with FIGS. 9A-9C, end portions of the second semiconductor layers 25 are also horizontally etched, as shown in FIG. 10B. The recessed amount of the first semiconductor layers 20 is greater than the recessed amount of the second semiconductor layers 25. Thus, as shown in FIG. 10B, a length of the first channel layers is smaller than a distance between vertical outer surfaces of the sidewall spacers.

The depth D1 of the recessing of the first semiconductor layers 20 from the plane including one sidewall spacer is in a range from about 5 nm to about 10 nm, the depth D2 of the recessing of the second semiconductor layers 25 from the plane including one sidewall spacer is in a range from about 1 nm to about 4 nm, in some embodiments. The difference D3 of the depth D1 and the depth D2 is in a range from about 1 nm to about 9 nm, in some embodiments.

In certain embodiments, the etching (horizontally recessing) the first and second semiconductor layers is not performed. In other embodiments, the amounts of etching of the first and second semiconductor layers are substantially the same (difference is less than about 0.5 nm).

After the first semiconductor layers 20 are horizontally recessed, a liner epitaxial layer 70 is formed on the recessed surfaces of the first and second semiconductor layers 20, 25, as shown in FIGS. 11A-11C. The liner epitaxial layer 70 is also formed on the recessed fin structure 11 at the S/D regions.

In some embodiments, the liner epitaxial layer 70 is undoped silicon. In other embodiments, the liner epitaxial layer includes one or more layers of Si, SiP and SiCP. In certain embodiments, the liner epitaxial layer 70 is made of one or more layers of SiGe and Ge. The thickness of the liner epitaxial layer 70 on the recessed surface of the first semiconductor layers 20 is in a range from about 5 nm to about 10 nm, in some embodiments. The thickness of the liner epitaxial layer 70 on the recessed surface of the second semiconductor layers 25 is in a range from about 1 nm to about 4 nm, in some embodiments. The thickness of the liner epitaxial layer 70 on the recessed surface of the second semiconductor layers 25 is about 20% to about 60% of the thickness of the liner epitaxial layer 70 on the recessed surface of the first semiconductor layers 20, in certain embodiments. The liner epitaxial layer 70 is selectively grown on the semiconductor layers.

Figure 12:
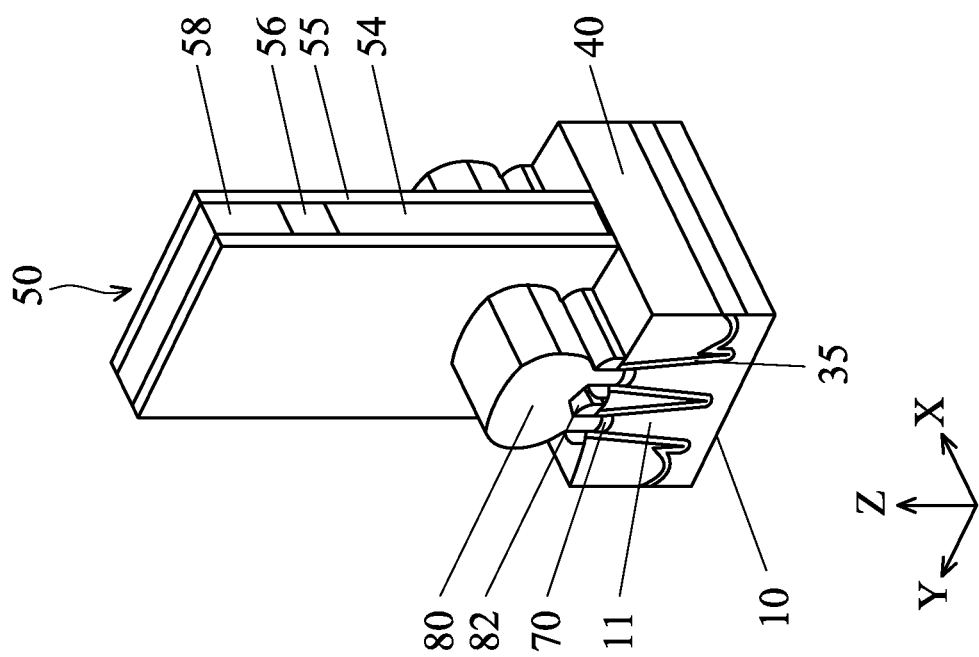

After the liner epitaxial layer 70 is formed, source/drain (S/D) epitaxial layers 80 are formed, as shown in FIG. 12.

The S/D epitaxial layer 80 includes one or more layers of Si, SiP, SiC and SiCP for an n-channel FET or Si, SiGe, Ge for a p-channel FET. The S/D layers 80 are formed by an epitaxial growth method using CVD, ALD or molecular beam epitaxy (MBE).

As shown in FIG. 12, the S/D epitaxial layers grow from the liner layers 70 formed on respective surfaces of bottoms 11 of two fin structures. The grown epitaxial layers merge above the isolation insulating layer and form a void 82 in some embodiments.

Figure 13:
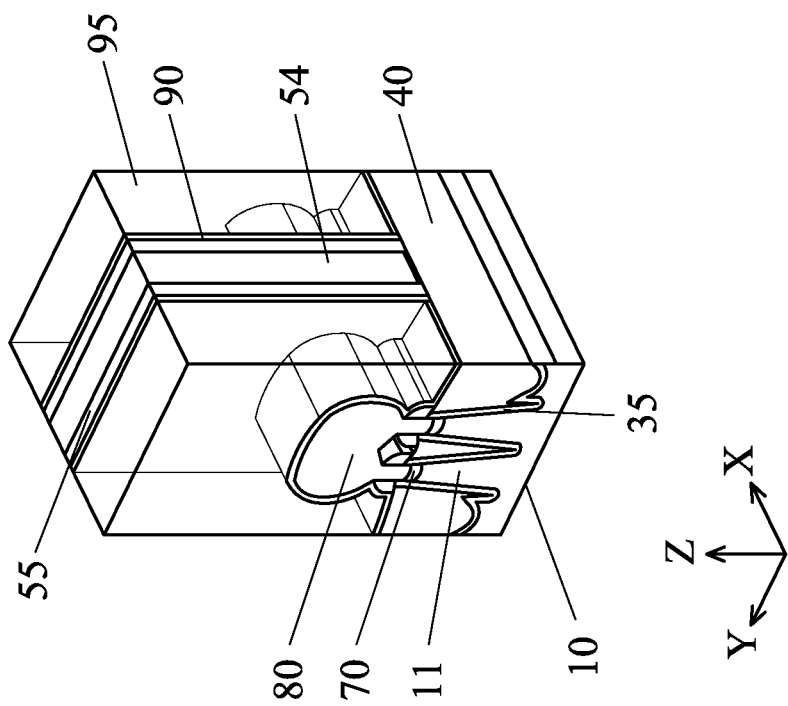

Subsequently, a second liner layer 90 is formed and then an interlayer dielectric (ILD) layer 95 is formed, as shown in FIG. 13. The second liner layer 90 is made of a silicon nitride-based material, such as SiN, and functions as a contact etch stop layer in the subsequent etching operations.

The materials for the ILD layer 95 include compounds comprising Si, O, C and/or H, such as silicon oxide, SiCOH and SiOC. Organic materials, such as polymers, may be used for the ILD layer 95.

After the ILD layer 95 is formed, a planarization operation, such as CMP, is performed, so that the top portion of the sacrificial gate electrode layer 54 is exposed.

Figure 14:
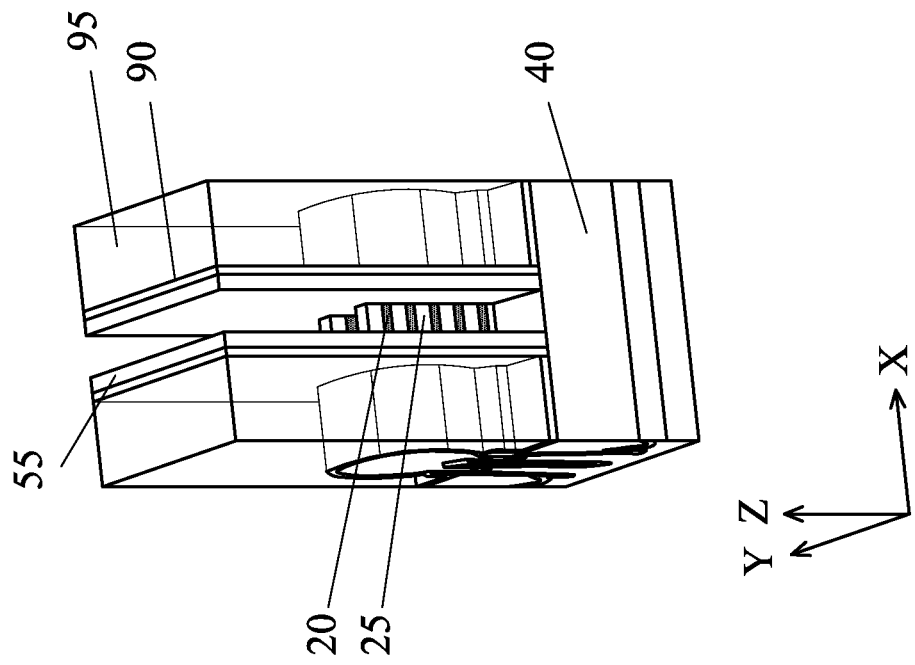

Next, as shown in FIG. 14, the sacrificial gate electrode layer 54 and sacrificial gate dielectric layer 52 are removed, thereby exposing the fin structures.

The ILD layer 95 protects the S/D structures 80 during the removal of the sacrificial gate structures. The sacrificial gate structures can be removed using plasma dry etching and/or wet etching. When the sacrificial gate electrode layer 54 is polysilicon and the ILD layer 95 is silicon oxide, a wet etchant such as a TMAH solution can be used to selectively remove the sacrificial gate electrode layer 54. The sacrificial gate dielectric layer 52 is thereafter removed using plasma dry etching and/or wet etching.

After the sacrificial gate structures are removed, the first semiconductor layers 20 in the fin structures are removed, thereby forming wires of the second semiconductor layers 25, as shown in FIGS. 15A and 15B. FIG. 15B is the cross sectional view along the fin structure.

The first semiconductor layers 20 can be removed or etched using an etchant that can selectively etch the first semiconductor layers 20 against the second semiconductor layers 25.

When the first semiconductor layers 20 are Ge or SiGe and the second semiconductor layers 25 are Si, the first semiconductor layers 20 can be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution.

When the first semiconductor layers 20 are Si and the second semiconductor layers 25 are Ge or SiGe, the first semiconductor layers 20 can be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution.

In the present embodiment, since the liner epitaxial layer 70 (e.g., Si) is formed, the etching of the first semiconductor layers 20 (e.g., SiGe) stops at the liner epitaxial layer 70. When the first semiconductor layers 20 are made of Si, the liner epitaxial layer 70 can be SiGe or Ge. Since the etching of the first semiconductor layers 20 stop at the liner epitaxial layer 70, it is possible to prevent the gate electrode and the S/D epitaxial layer from contacting or bridging.

Figure 16:
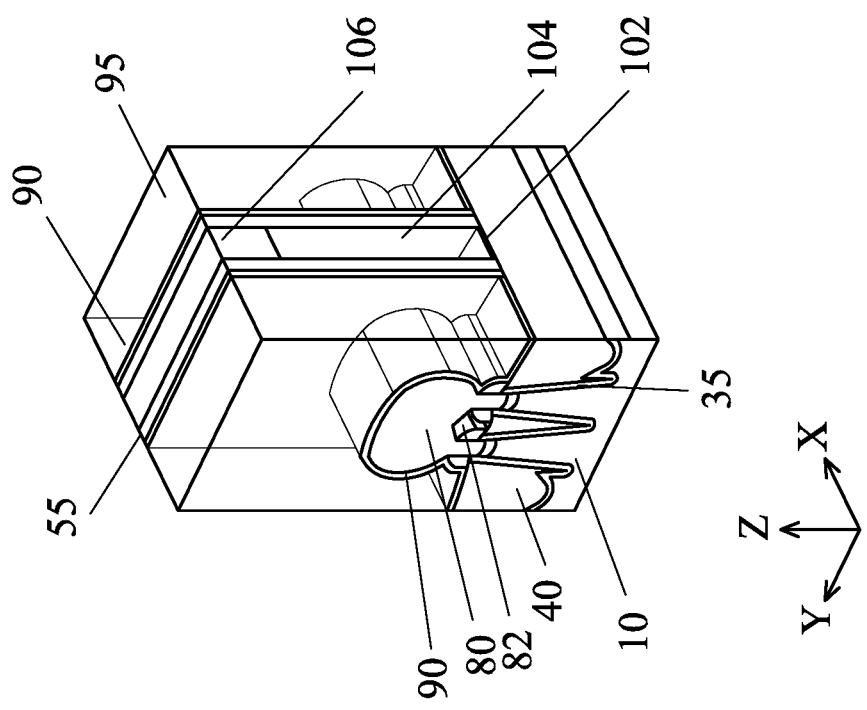

After the wires of the second semiconductor layers 25 are formed, a gate dielectric layer 102 is formed around each channel layers (wires of the second semiconductor layers 25), and a gate electrode layer 104 is formed on the gate dielectric layer 102, as shown in FIG. 16.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 102 includes an interfacial layer formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 104 is formed on the gate dielectric layer 102 to surround each channel layers. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer is also deposited over the upper surface of the ILD layer 95. The gate dielectric layer and the gate electrode layer formed over the ILD layer 95 are then planarized by using, for example, CMP, until the top surface of the ILD layer 95 is revealed.

After the planarization operation, the gate electrode layer 104 is recessed and a cap insulating layer 106 is formed over the recessed gate electrode 104, as shown in FIG. 16. The cap insulating layer includes one or more layers of a silicon nitride-based material, such as SiN. The cap insulating layer 106 can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 17:
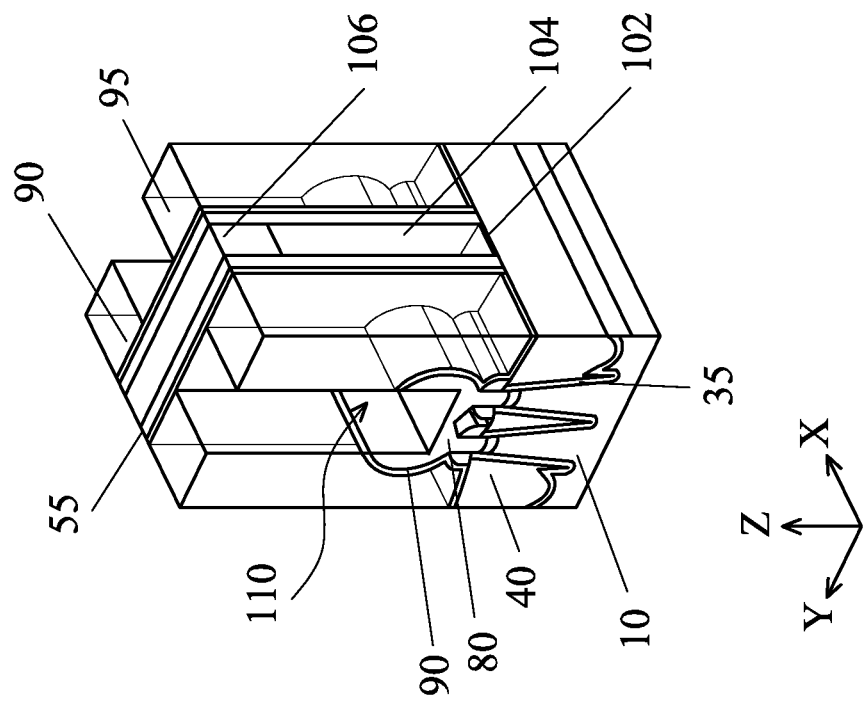

Subsequently, contact holes 110 are formed in the ILD layer 95 by using dry etching, as shown in FIG. 17. In some embodiments, the upper portion of the S/D epitaxial layer 80 is etched.

A silicide layer 120 is formed over the S/D epitaxial layer 80, as shown in FIG. 18. The silicide layer includes one or more of WSi, CoSi, NiSi, TiSi, MoSi and TaSi. Then, a conductive material 130 is formed in the contact holes as shown in FIG. 19. The conductive material 130 includes one or more of Co, Ni, W, Ti, Ta, Cu, Al, TiN and TaN.

Figure 20C:
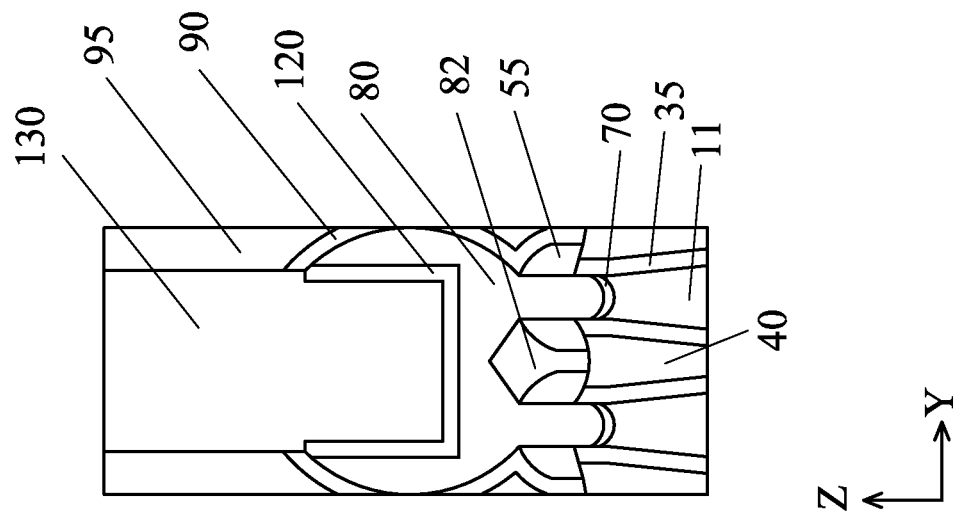
Figure 20B:
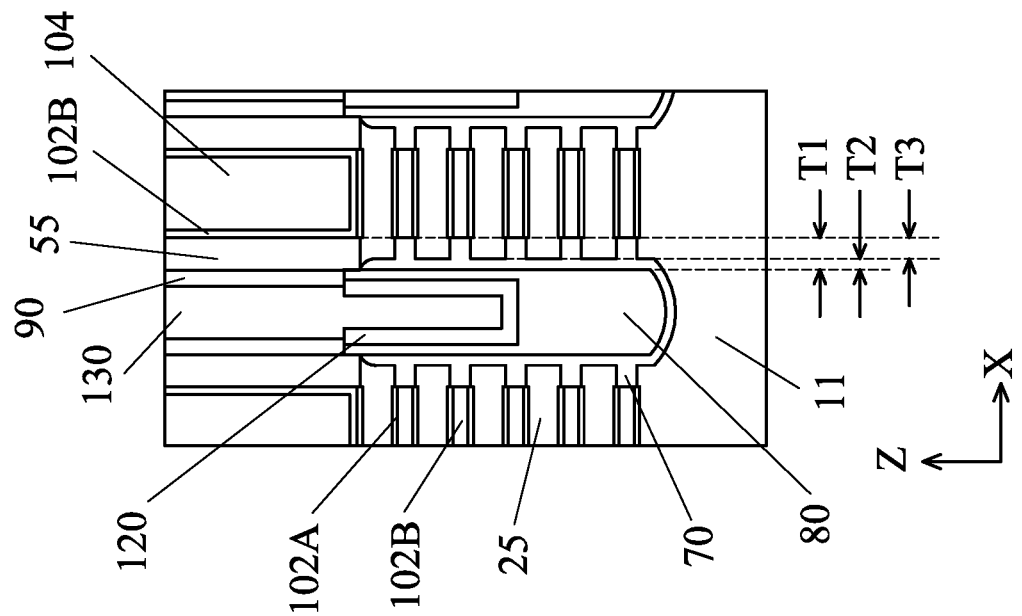
Figure 20A:
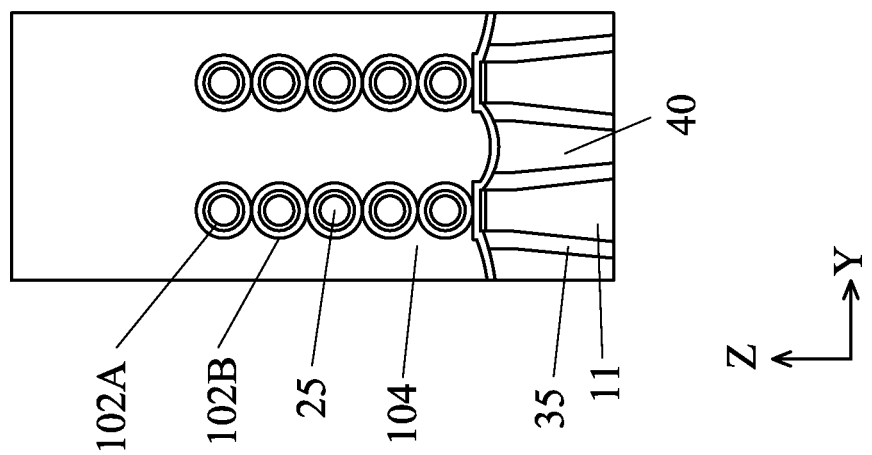

FIGS. 20A-20C show cross sectional views of the structure of FIG. 19. FIG. 20A shows the cross sectional view cutting the gates along the Y direction, FIG. 20B shows the cross sectional view cutting the gates along the X direction and FIG. 20C shows the cross sectional view cutting the S/D region along the Y direction.

As shown in FIG. 20A, the wires made of the second semiconductor layer 25 are stacked in the Z direction. It is noted that the second semiconductor layers 25 may also be etched when the first semiconductor layer 20 are removed, and thus the corners of the second semiconductor layers 25 are rounded. An interfacial layer 102A wraps around each of the wires, and the gate dielectric layer 102B covers the interfacial layer 102A. Although the gate dielectric layer 120B wrapping around one wire is in contact with that of the adjacent wire in FIG. 20A, the structure is not limited to FIG. 20A. In other embodiments, the gate electrode 104 also wraps around each of the wires covered by the interfacial layer 102A and the gate dielectric layer 102B.

As shown in FIG. 20B, the liner epitaxial layer 70 is formed between the S/D epitaxial layer 80 and the wires (second semiconductor layers 25). The thickness T1 of the liner epitaxial layer 70 at the portion between the wires is in a range from about 5 nm to about 10 nm, the thickness T2 of the recessing of the liner epitaxial layer 70 at the ends of the wires is in a range from about 1 nm to about 4 nm, in some embodiments. The difference T3 of the thickness T1 and the thickness T2 is in a range from about 1 nm to about 9 nm, in some embodiments. The thickness T2 is about 20% to about 60% of the thickness T1 in certain embodiments, and is about less than 40% in other embodiments.

It is understood that the GAA FETs undergoes further CMOS processes to form various features such as contacts/vias, interconnect metal layers, dielectric layers, passivation layers, etc.

The various embodiments or examples described herein offer several advantages over the existing art. For example, in the present disclosure, since the etching of the first semiconductor layers 20 stop at the liner epitaxial layer 70, it is possible to prevent the gate electrode and the S/D epitaxial layer from contacting or bridging. In addition, it is possible to adjust the proximity between the S/D epitaxial layer and the channel layer.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first semiconductor layer sandwiched by second semiconductor layers in a first direction is formed over a substrate. The first semiconductor layer and the second semiconductor layers are patterned into a fin structure such that the fin structure includes sacrificial layers made by the second semiconductor layers and a channel layer made by the first semiconductor layer. A sacrificial gate structure is formed over the fin structure such that the sacrificial gate structure covers a part of the fin structure while remaining parts of the fin structure remains exposed. The remaining parts of the fin structure, which are not covered by the sacrificial gate structure, are removed. The sacrificial layers are horizontally recessed so that edges of the sacrificial layers are located below a side face of the sacrificial gate structure. A liner epitaxial layer is formed at least on the recessed surface of the sacrificial layers. A source/drain region is formed. The sacrificial gate structure is removed. The sacrificial layer in the fin structure is removed after removing the sacrificial gate structure so that the channel layer is exposed. A gate dielectric layer and a gate electrode layer are formed around the exposed channel layer.

In accordance with another one aspect of the present disclosure, in a method of manufacturing a semiconductor device, a first semiconductor layer sandwiched by second semiconductor layers in a first direction is formed over a substrate. The first semiconductor layer and the second semiconductor layers are patterned into a fin structure such that the fin structure includes sacrificial layers made by the second semiconductor layers and a channel layer made by the first semiconductor layer. A sacrificial gate structure is formed over the fin structure such that the sacrificial gate structure covers a part of the fin structure while remaining parts of the fin structure remains exposed. The remaining parts of the fin structure, which are not covered by the sacrificial gate structure, are removed. A liner epitaxial layer is formed at least on the recessed surface of the sacrificial layers. A source/drain region is formed. The sacrificial gate structure is removed. The sacrificial layer in the fin structure is removed after removing the sacrificial gate structure so that the channel layer is exposed. A gate dielectric layer and a gate electrode layer are formed around the exposed channel layer.

In accordance with another aspect of the present disclosure, a semiconductor device includes first channel layers disposed over a substrate, a first source/drain region disposed over the substrate, a gate dielectric layer disposed on and wrapping each of the first channel layers, a gate electrode layer disposed on the gate dielectric layer and wrapping each of the first channel layers, and a liner semiconductor layer disposed between the first channel layers and the first source/drain region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   first channel layers disposed over a bottom fin structure protruding from a substrate;
   a gate dielectric layer disposed on and wrapping each of the first channel layers;
   a gate electrode layer disposed on the gate dielectric layer;
   sidewall spacers disposed on opposing side faces of the gate electrode layer;
   a source/drain epitaxial layer; and
   a liner semiconductor layer disposed between the first channel layers and the source/drain epitaxial layer, wherein:

a length of the first channel layers is smaller than a distance between vertical outer surfaces of the sidewall spacers, the liner semiconductor layer is in direct contact with vertical end faces of the first channel layers, and the liner semiconductor layer includes first portions disposed between adjacent first channel layers in a vertical direction and a second portion connecting the first portions.

2. The semiconductor device of claim 1, wherein the liner semiconductor layer includes a third portion extending from the second portion and disposed on an upper surface of the bottom fin structure.

3. The semiconductor device of claim 2, further comprising an isolation insulating layer covering sides of the bottom fin structure, wherein the upper surface of the bottom fin structure on which the third portion of the liner semiconductor layer is disposed is located below an upper surface of the isolation insulating layer.

4. The semiconductor device of claim 1, wherein the source/drain epitaxial layer is not in contact with the first channel layers.

5. The semiconductor device of claim 1, wherein the first channel layers are made of Si or a Si-based compound.

6. The semiconductor device of claim 1, wherein the liner semiconductor layer is made of Si or a Si-based compound.

7. The semiconductor device of claim 1, wherein the liner semiconductor layer is disposed between the gate electrode layer and the source/drain epitaxial layer in a horizontal direction along which the first channel layer extends.

8. A semiconductor device, comprising:
first channel layers disposed over a bottom fin structure protruding from a substrate;
second channel layers disposed over the bottom fin structure;
a first gate dielectric layer disposed on and wrapping each of the first channel layers, and a first gate electrode layer disposed on the first gate dielectric layer;
a second gate dielectric layer disposed on and wrapping each of the second channel layers, and a second gate electrode layer disposed on the second gate dielectric layer;
a source/drain epitaxial layer disposed between the first channel layers and the second channel layers; and
a liner semiconductor layer disposed between the first channel layers and the source/drain epitaxial layer and between the second channel layers and the source/drain epitaxial layer, wherein:
vertical end surfaces of the first channel layers face vertical end surfaces of the second channel layers, and
the liner semiconductor layer covers the vertical end surfaces of the first channel layers and the vertical end surfaces of the second channel layers.

9. The semiconductor device of claim 8, wherein the liner semiconductor layer includes:
first portions disposed between adjacent first channel layers in a vertical direction;
second portions connecting the first portions;
third portions disposed between adjacent second channel layers in the vertical direction; and
fourth portions connecting the third portions.

10. The semiconductor device of claim 9, wherein the liner semiconductor layer includes a fifth portion connecting the second portion and the fourth portion and disposed on an upper surface of the bottom fin structure.

11. The semiconductor device of claim 8, wherein the source/drain epitaxial layer is not in contact with the first channel layers.

12. The semiconductor device of claim 8, wherein:
the first channel layers are made of Si or a Si-based compound, and
the liner semiconductor layer is made of Si or a Si-based compound.

13. The semiconductor device of claim 8, wherein the liner semiconductor layer is disposed on the bottom fin structure.

14. A semiconductor device, comprising:
first channel layers disposed over a bottom fin structure protruding from a substrate;
a gate dielectric layer disposed on and wrapping each of the first channel layers;
a gate electrode layer disposed on the gate dielectric layer;
sidewall spacers disposed on opposing side faces of the gate electrode layer;
a source/drain epitaxial layer;
a liner semiconductor layer disposed between the first channel layers and the source/drain epitaxial layer; and
a conductive material layer in contact with the source/drain epitaxial layer, wherein:
the liner semiconductor layer is in contact with vertical end faces of the first channel layers and is continuously formed to directly connect the first channel layers, and
the conductive material layer penetrates into the source/drain epitaxial layer.

15. The semiconductor device of claim 14, wherein the conductive material layer includes a silicide layer in contact with the source/drain epitaxial layer and a conductive material layer disposed on the silicide layer.

16. The semiconductor device of claim 14, wherein the silicide layer is separated from the liner semiconductor layer by the source/drain epitaxial layer.

17. The semiconductor device of claim 14, wherein:
the liner semiconductor layer includes first portions disposed between adjacent first channel layers in a vertical direction, a second portion connecting the first portions, and a third portion extending from the second portion and disposed on an upper surface of the bottom fin structure.

18. The semiconductor device of claim 17, further comprising an isolation insulating layer covering sides of the bottom fin structure,
wherein the upper surface of the bottom fin structure on which the third portion of the liner semiconductor layer is disposed is located below an upper surface of the isolation insulating layer.

19. The semiconductor device of claim 17, wherein the source/drain epitaxial layer is not in contact with the first channel layers.

20. The semiconductor device of claim 17, wherein the liner semiconductor layer is disposed between the gate electrode layer and the source/drain epitaxial layer in a horizontal direction along which the first channel layer extends.

* * * * *